(12) United States Patent
Walsh et al.

(10) Patent No.: US 9,692,260 B2
(45) Date of Patent: Jun. 27, 2017

(54) DYNAMIC WIRELESS POWER CONTROL

(75) Inventors: Jim Walsh, Santa Clara, CA (US);
Joshua R. Smith, Seattle, WA (US);
Issy Kipnis, Berkeley, CA (US); Gamil A. Cain, El Dorado Hills, CA (US)

(73) Assignee: INTEL CORPORATION, Santa Clara, CA (US)

( * ) Notice: Subject to any disclaimer, the term of this patent is extended or adjusted under 35 U.S.C. 154(b) by 539 days.

(21) Appl. No.: 13/976,340

(22) PCT Filed: Nov. 3, 2011

(86) PCT No.: PCT/US2011/059054
§ 371 (c)(1),
(2), (4) Date: Dec. 26, 2013

(87) PCT Pub. No.: WO2013/066326
PCT Pub. Date: May 10, 2013

(65) Prior Publication Data
US 2014/0103734 A1    Apr. 17, 2014

(51) Int. Cl.
*H01F 27/42*    (2006.01)
*H01F 37/00*    (2006.01)
(Continued)

(52) U.S. Cl.
CPC ........... *H02J 17/00* (2013.01); *G01R 1/20* (2013.01); *G01R 19/252* (2013.01); *H04W 52/10* (2013.01); *Y02B 60/50* (2013.01)

(58) Field of Classification Search
CPC ...... G01R 35/005; G01R 35/00; G01R 19/00; H03F 1/3241; H04B 10/272; H04B 10/00;
(Continued)

(56) References Cited

U.S. PATENT DOCUMENTS

| | | | |
|---|---|---|---|
| 5,485,300 A * | 1/1996 | Daley ................ | H04B 10/272 372/30 |
| 8,170,819 B2 * | 5/2012 | Raghavan ............ | H03F 1/3241 324/76.12 |

(Continued)

OTHER PUBLICATIONS

International Search Report, PCT/ISA/210, Feb. 2, 2012, total of 2 sheets.

*Primary Examiner* — Rexford Barnie
*Assistant Examiner* — Jagdeep Dhillon
(74) *Attorney, Agent, or Firm* — Pillsbury Winthrop Shaw Pittman LLP (57) ABSTRACT

In accordance with various aspects of the disclosure, devices and methods are disclosed that include measuring, at a transmitter, a reflected power level corresponding to a specific transmit power level, and setting the transmit power to an operational level. At the transmitter, a new operational level of the transmit power may be determined, for example, by selecting at least one trial transmit power level, and based on reflected power levels measured corresponding to the operational level and the at least one trial level of the transmit power, either maintaining the operational level as the new operational level, or determining the at least one trial level as the new operational level. The operational transmit power level may correspond to a lowest reflected power level, or a highest rate of change of the reflected power level with respect to the transmit power level.

21 Claims, 7 Drawing Sheets

(51) Int. Cl.
  *H01F 38/00* (2006.01)
  *H02J 17/00* (2006.01)
  *G01R 1/20* (2006.01)
  *G01R 19/252* (2006.01)
  *H04W 52/10* (2009.01)

(58) Field of Classification Search
  CPC . H04B 1/18; H04B 7/00; H04B 17/00; H04B 1/40
  USPC .......... 307/104, 149, 66, 39, 64, 80, 43; 324/119, 118, 76.12, 76.11; 372/30; 455/41.2, 67.11, 193.1, 77
  See application file for complete search history.

(56) References Cited

U.S. PATENT DOCUMENTS

| | | |
|---|---|---|
| 2002/0045460 A1 | 4/2002 | Makinen et al. |
| 2006/0064018 A1 | 3/2006 | Chomas |
| 2006/0230211 A1 | 10/2006 | Woodral |
| 2007/0259659 A1 | 11/2007 | Bennett |
| 2009/0121963 A1* | 5/2009 | Greene .............. H03H 7/40 343/861 |
| 2011/0059706 A1* | 3/2011 | Harel ............... H04B 7/0404 455/115.1 |
| 2012/0067872 A1* | 3/2012 | Libman ............ H05B 6/647 219/702 |
| 2013/0049735 A1* | 2/2013 | Shafer .............. H03F 1/523 324/76.11 |
| 2013/0065545 A1* | 3/2013 | Krivokapic ........ H01Q 9/0442 455/115.1 |
| 2013/0082687 A1* | 4/2013 | Chizevsky .......... G01R 35/005 324/120 |

* cited by examiner

DYNAMIC WIRELESS POWER CONTROL

CROSS REFERENCE TO RELATED APPLICATIONS

This application is the U.S. National Stage of PCT/US2011/059054, filed Nov. 30, 2011, the contents of which are hereby incorporated by reference herein in its entirety.

BACKGROUND

This disclosure relates generally to the field of power transmission, and in particular, to a method and apparatus for wirelessly transmitting and receiving power.

Recent advances in wireless power/energy transfer systems, especially resonance-based technologies, have made the wireless transfer of power more efficient over longer distances. However, typically, in wireless power systems, a receiving device or apparatus (or in general, a "receiver") determines if the current received power level should be adjusted (e.g., increased or decreased), and by what amount, e.g., based on the current load and spatial location of the receiver. The receiver may then communicate that information to a transmitting device or apparatus (or in general, a "transmitter"). For example, the receiver may convert the power adjustment information into digital data, and communicate the information to the transmitter using a digital communication mechanism based on the receiver modulating its load and the transmitter detecting the load modulation. The transmitter may adjust the transmit power level based on the digital information received from the receiver. However, such receiver-implemented techniques relating determination and communication of information for control of transmit power level result in increased cost and complexity at the receiver.

DETAILED DESCRIPTION

In the description that follows, like components have been given the same reference numerals, regardless of whether they are shown in different embodiments. To illustrate an embodiment(s) of the present disclosure in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

In accordance with some aspects of the present disclosure, methods and devices disclosed herein may be associated with a wireless power system, and may be implemented as a part of, or associated with, a component of the wireless power system that is configured as the wireless power transmitter. Methods and apparatus disclosed herein relate to dynamically controlling the wirelessly transmitted power.

In accordance with various embodiments of this disclosure, a wireless power transmitting device is presented that controls the wireless transmit power, and the device includes a measurement module and a power control module. The measurement module may be configured to measure a reflected power level for a specific value of a transmit power level. The power control module may be configured to set the transmit power to an operational level, and determine a new operational level of the transmit power. In some embodiments, to determine the new operational level, the power control module is further configured to select at least one trial transmit power level, and based on reflected power levels measured corresponding to the operational level and the at least one trial level of the transmit power, either maintain the operational level as the new operational level, or determine the at least one trial level as the new operational level.

In accordance with various embodiments of this disclosure, a power control method is disclosed that includes measuring, at a transmitter, a reflected power level corresponding to a specific transmit power level, and setting, at the transmitter, the transmit power to an operational level. In the method, a new operational level of the transmit power may be determined by executing various operations including selecting at least one trial transmit power level, and based on reflected power levels measured corresponding to the operational level and the at least one trial level of the transmit power, either maintaining the operational level as the new operational level, or determining the at least one trial level as the new operational level. The operation of determining the new operational level operation may be performed periodically, e.g., in accordance with a predetermined period.

In some embodiments, the operational transmit power level corresponds to a lowest reflected power level. In that case, the operation of determining the new operational level may include determining the transmit power level corresponding to the least of the measured reflected power levels related to the operational level and the at least one trial level as the new operational level.

In some embodiments, the operational transmit power level corresponds to a highest rate of change of the reflected power level with respect to the transmit power level, and the operational transmit power level being less than a transmit power level that corresponds to a lowest reflected power level. In such embodiments, the operation of determining the new operational level may include selecting at least two trial transmit power levels, e.g., one less than and the other greater than the operational transmit power level. A first rate of change of the reflected power level corresponding to the operational level and a first of the at least two trial levels, and a second rate of change of the reflected power level corresponding to the operational level and a second of the at least two trial levels may be determined. The trial transmit power level corresponding to the least of the first and second rates of change (e.g., if it is greater than zero) may be set as the new operational level of the transmit power.

The method may further include initializing, at the transmitter, the transmit power to an initial level, and decreasing the transmit power from the initial level to the operational level. The initial transmit power level may be less than the transmit power level that corresponds to a lowest reflected power level. Additionally, the method may include comprising determining whether a receiver is present, within an operational range of the transmitter, or both, e.g., asynchronous to the operation of determining the new operational level. Further, if it is determined that the receiver is not present, or is not within an operational range of the transmitter, the transmitter may be configured to cease power transmission.

In accordance with various embodiments of this disclosure, a non-transitory computer-readable medium comprising computer-readable instructions is disclosed. The computer-readable instructions when executed by one or more processors may cause the one or more processors to carry out a plurality of operations including, but not limited to, the operations of one or more methods disclosed herein (as discussed in detail below).

These and other features and characteristics, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of claims. As used in the specification and in the claims, the singular form of "a", "an", and "the" include plural referents unless the context clearly dictates otherwise.

Figure 1:
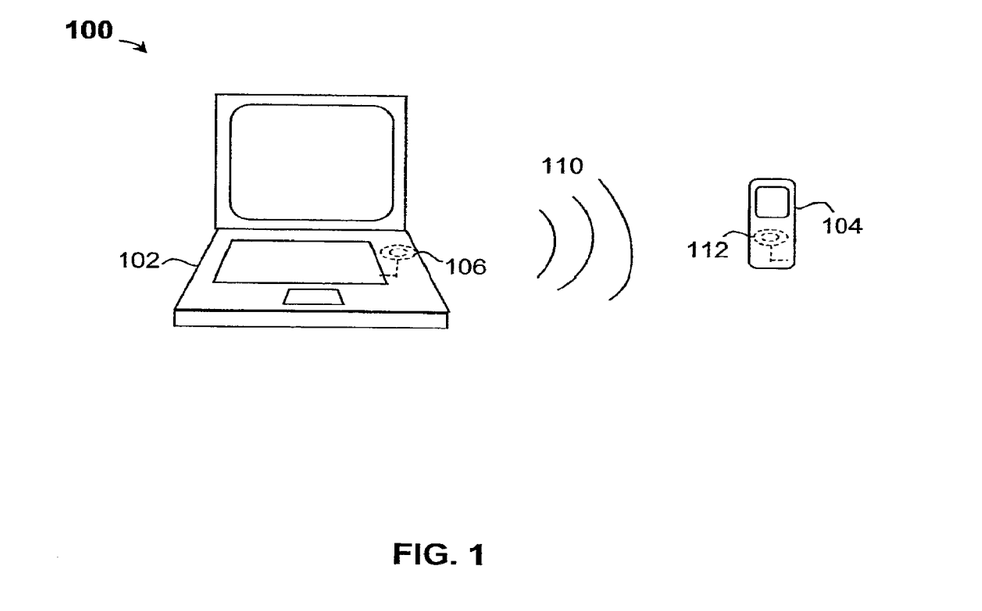
FIG. 1 depicts shows an exemplary system concept diagram of wireless power transmission system, in accordance with various aspects of the present disclosure.

Turning now to the various aspects of the disclosure, FIG. 1 depicts an exemplary diagram representing wireless transmission environment 100, in accordance with various exemplary embodiments of the present disclosure. A wireless transmitting source, such as, for example, wireless host computing device 102, transmits power to a wireless receiving destination, such as, for example, wireless receiving device 104. The transmitted power is wirelessly conveyed via an electromagnetic field generated by transmitter antenna 106, represented by arcuate curves 110 in FIG. 1, that is received by receiver antenna 112. In one embodiment, wireless host computing device 102 and wireless receiving device 104 are configured to have a mutually compatible resonant relationship, namely, the resonant frequency of wireless receiving device 104 corresponds to the resonant frequency of wireless host computing device 102.

By way of illustration only, and in no way limiting, wireless host computing device 102 is represented as a laptop and wireless receiving device 104 is illustrated as a cellular phone. However, as can be contemplated by one of ordinary skill in the art after reading this disclosure, wireless host computing device 102 may be a desktop personal computer (PC) or standalone wireless charging device not integrated with other equipment, while wireless receiving device 104 may be a computing devices (e.g., a personal digital assistant or PDA device), a mobile computing device (e.g., a smart-phone with computing capabilities), or other device/appliance configured with wireless power reception capabilities.

It will also be appreciated that, although one wireless host computing device 102 and one wireless receiving device 104 are shown in environment 100 of FIG. 1, various aspects of the disclosure can relate to other number of wireless host computing devices and receiving devices, as can be contemplated by one of ordinary skill in the art after reading this disclosure. For example, environment 100 may have one wireless host computing device transmitting power to two or more wireless receiving devices. Alternatively, a network of plurality of wireless host computing devices and wireless receiving devices may be used in environment 100 for the wireless transmission and reception of power, such that each of the wireless host computing devices and receiving devices may be a node in such a network system.

Figure 2:
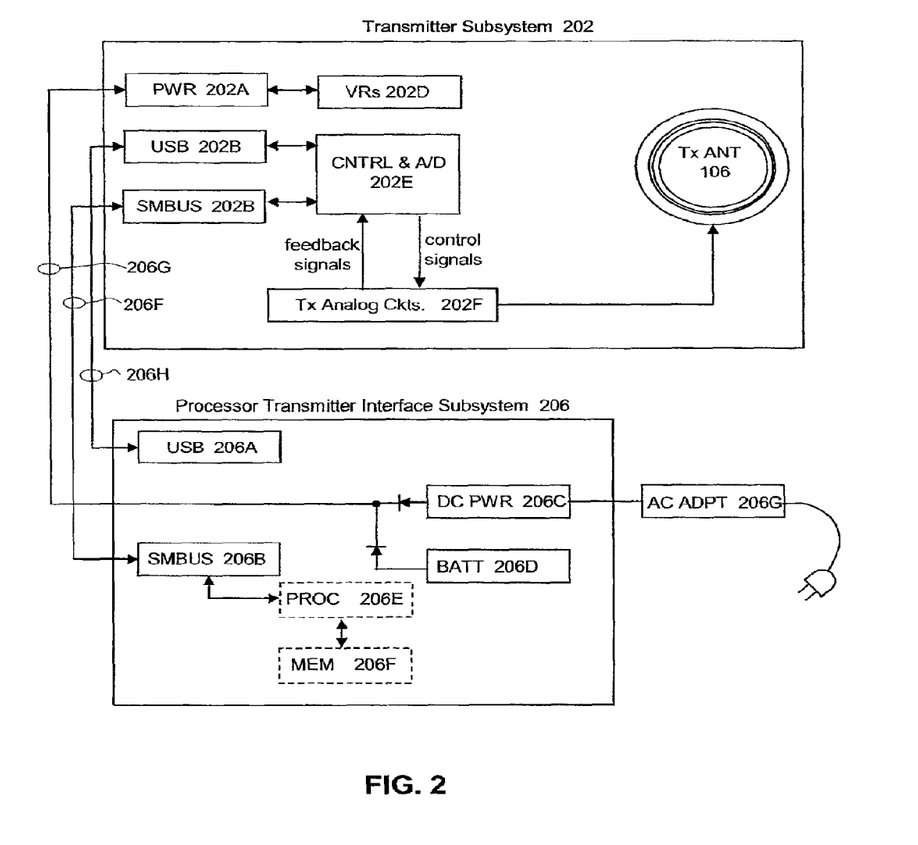
FIG. 2 depicts a functional block diagram of a transmitter subsystem and a processor transmitter interface subsystem, in accordance with various aspects of the present disclosure.

FIG. 2 depicts a functional block diagram of an exemplary transmitter subsystem 202 and processor transmitter interface subsystem 206 of wireless host computing device 102, in accordance with various exemplary embodiments of the present disclosure. The processor transmitter interface subsystem 206 operates under the control of processor or controller 206E of wireless host computing device 102 and controls the configuration of various transmitting parameters of transmitter subsystem 202, based upon one or more transmission policies stored in memory 206F of host computing device 102. Such policies may include operating rules, such as, only transmit power when AC power is present, only transmit power when battery is engaged, limit transmit power based on heat detection, terminate power transmission when detected battery power is below a predetermined threshold, etc. Once configured transmitter subsystem 202 functions autonomously and is not dependent on other software or hardware to transmit power.

Processor 206E may be one or more microprocessors or microcontrollers such as those made by Intel Corporation of Santa Clara, Calif. (although other vendors may be used). In one example, processor 206E may form a compute complex on a circuit board and may include one or more microprocessor units, or any other combination of logic circuits capable of executing the functionality and methodologies of wireless host computing device 102 as described herein below.

Memory 206F coupled to processor 206E may be one or more of the following types of memory: SRAM; BSRAM; or EDRAM. Other examples include the following types of memory: Static random access memory (SRAM), Burst SRAM or SynchBurst SRAM (BSRAM), Dynamic random access memory (DRAM), Fast Page Mode DRAM (FPM DRAM), Enhanced DRAM (EDRAM), Extended Data Output RAM (EDO RAM), Extended Data Output DRAM (EDO DRAM), Burst Extended Data Output DRAM (BEDO DRAM), Enhanced DRAM (EDRAM), synchronous DRAM (SDRAM), JEDECSRAM, PCIOO SDRAM, Double Data Rate SDRAM (DDR SDRAM), Enhanced SDRAM (ESDRAM), SyncLink DRAM (SLDRAM), Direct Rambus DRAM (DRDRAM), Ferroelectric RAM (FRAM), or any other type of memory device capable of executing functionality and methodologies described herein below.

Communication between processor transmitter interface subsystem 206 and transmitter subsystem 202 is achieved via a bus infrastructure. In one embodiment, processor transmitter interface subsystem 206 delivers configuration, control, status, and power-related information to transmitter subsystem 202 through bus infrastructure comprising buses 206F, 206G, and 206H. That is, bus 206H (e.g., USB) may be configured to convey configuration and control information and bus 206F (e.g., SM Bus) may be configured to convey battery and charging status information to the transmitter subsystem 202 controller 202E, while bus 206G may be configured to supply power to transmitter subsystem 202. Although various bus configurations have been described, it should be understood that other types of serial or parallel buses known to one of ordinary skill in the art may be used.

Because wireless host computing device 102 may, itself, be powered by an external source or battery, processor transmitter interface subsystem 206 includes power coupler 206C as well as battery 206D. Power coupler 206C receives a regulated DC voltage signal from AC adapter 206G that connects to an external AC power supply. It will be appreciated that AC adapter 206G may include transformer circuits, rectifying circuits, and other circuitry to ensure a proper DC voltage signal level, as can be contemplated by one of ordinary skill in the art.

The DC voltage signal, from either power coupler 206C or battery is supplied to transmitter subsystem 202 via bus 206G to power coupler 202A. The DC voltage signal is then regulated by voltage regulator(s) 202D of transmitter subsystem 202 to account for any variations due to coupling and battery output voltage, and ensure a constant DC voltage signal level.

As noted above, controller 202E of transmitter subsystem 202 receives configuration, control information, and status information via buses 206F, 206H. In turn, controller 202E provides control signals to, and receives feedback signals from, transmit analog circuitry 202F. Controller 202E may be one or more microprocessors or microcontrollers such as those made by Intel Corporation of Santa Clara, Calif. (although other vendors may be used). Transmit analog circuitry 202F, described in more detail below, operates to energize transmit antenna 106 in accordance with the control signals provided by controller 202E.

Figure 3:
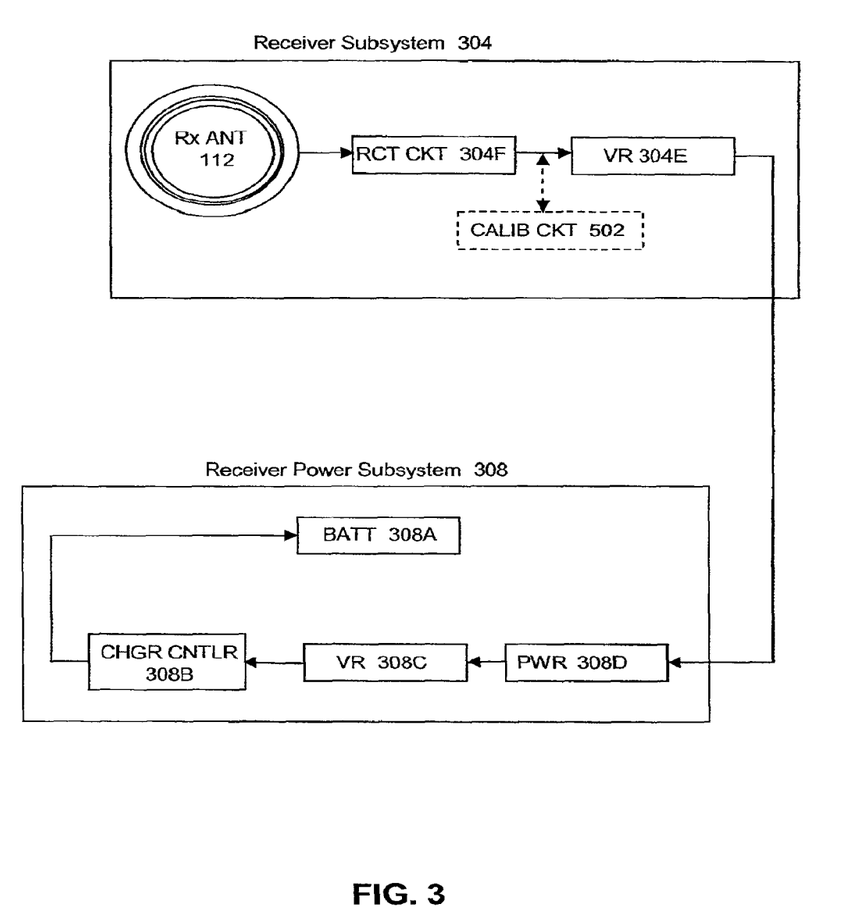
FIG. 3 depicts a functional block diagram of a receiver subsystem and receiver power subsystem, in accordance with various aspects of the present disclosure.

Turning to the receiving side, FIG. 3 depicts a functional block diagram of an exemplary receiver subsystem 304 and receiver power subsystem 308 of wireless receiving device 104, in accordance with various exemplary embodiments of the present disclosure. The transmitted power wirelessly conveyed by transmitter antenna 106, via field 110, is received by receiver antenna 112 of subsystem 304. As with transmitter antenna 106, receiver antenna 112 may comprise one or more of a coil antenna, helical antenna, a dipole antenna, a monopole antenna, a loop antenna, a patch antenna, a slot antenna, a Planar Inverted "F" (PIFA) antenna, and other types of antennas of suitable geometry and electrical properties depending upon specific transmission parameters associated with the power reception by wireless receiving device 104.

Receiver antenna 112 is coupled to a rectifier circuit 304F that converts the received energy into a DC voltage signal. Rectifier circuit 304A may comprise a full wave rectifying circuit, such as, for example, a bridge rectifier, or other circuitry suitable for such purposes. The DC voltage signal is then regulated by voltage regulator 304E to provide a regulated and constant DC voltage signal level.

The regulated DC voltage signal is provided to receiver power subsystem 308 via power coupler 308D and is then regulated again by voltage regulator 308C to account for any variations due to coupling and ensure a constant DC voltage signal level. The constant DC voltage signal is then provided to a charger controller 308B to control the charging voltage supplied to battery 308A. The charger controller 308B may comprise a processor, DC/DC converter(s), timing circuit(s), trickle charge circuit(s), protection circuit(s), and other circuitry to ensure the proper charging of battery 308A, as can be contemplated by one of ordinary skill in the art after reading this disclosure.

Receiver subsystem 304 may further include a timer and switch calibration circuit 502. In some embodiments and as discussed in more detail below (see, FIG. 5), for the wireless host computing device 102 to adequately detect the presence and range of wireless receiving device 104 and ameliorate introductory nonlinear variances caused by voltage regulator 304E, timer and switch calibration circuit 502 operates to present a predetermined fixed resistive load during an initial calibration time interval. Since the transmit power level and receive fixed load is known for this time interval, the presence of wireless receiving device 104 and the spatial distance between the receiving device 104 and wireless host computing device 102 can be determined.

Figure 4:
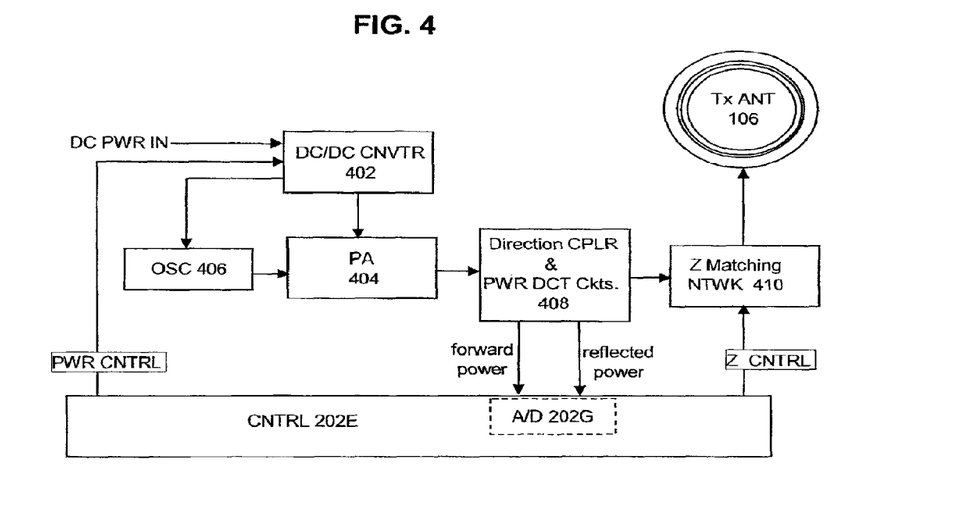
FIG. 4 depicts a functional block diagram of transmitter analog circuitry, in accordance with various aspects of the present disclosure.

As noted above, transmit analog circuitry 202F of transmitter subsystem 202 operates to energize transmit antenna 106 in accordance with control signals provided by controller 202E. FIG. 4 depicts a detailed functional block diagram of transmit analog circuitry 202F. In accordance with various embodiments of the present disclosure, transmit analog circuitry 202F comprises DC/DC converter circuitry 402, power amplifier 404, oscillating circuit 406, directional coupler and power detection circuitry 408, and impedance matching circuitry 410.

The DC/DC converter circuitry 402 provides a DC voltage signal at a constant or stable voltage level (e.g., 5 volts) to oscillator 406, and provides a DC signal with variable voltage (in accordance with control signals generated by controller 202E) to power amplifier 404. The DC voltage drives both oscillator 406 and power amplifier 404. For example, based on the inputted DC voltage, oscillator 406 generates a radio-frequency (RF) signal operating at a predetermined RF frequency (e.g., 13.5 MHz), while power amplifier 404 adjusts (e.g., steps up) the power level of the radio-frequency (RF) signal in accordance with the variable voltage of the received DC signal (e.g., to a maximum predetermined amount (e.g., 15 W)).

In turn, power amplifier 404 inputs a power signal to directional power coupler and power detector circuitry 408. It will be appreciated that transmit power is a function of power conveyed in a forward direction (i.e., forward power) from the transmission source and power reflected back (i.e., reflected power) towards the transmission source due to impedance mismatches. As such, the power directional coupler portion of circuitry 408 separates the power signal into a forward power signal and a reflected power signal. The power detector portion of circuitry 408 detects the levels of separated forward power and reflected power signals and converts the detected levels of forward power and reflected power into voltage signals. These voltage signals are supplied to A/D converter(s) 202G to generate DC voltage information representative of the forward power and reflected power levels to be processed by controller 202E.

Armed with the voltage information representing the forward power and reflected power levels, controller 202E functions to adjust and control the output power of power amplifier 404 by changing the operating voltage of the power amplifier 404 via a power control signal provided to DC/DC converter 402. Controller 202E also functions to adjust and control the tuning of impedance matching network 410 via an impedance control signal provided to impedance matching network 410. In one embodiment, controller 202E adjusts the output power transmitted as well as tunes the impedance, based on the detected level of reflected power. That is, controller 202E exploits the reflected power levels to estimate what current load is being drawn by wireless receiving device 104. For example, the current load being drawn by receiving device 104 indicates a certain load impedance, and controller 202E operates to adjust power amplifier 404 and impedance matching network 410 accordingly.

In accordance with various embodiments of the present disclosure, the configuration of transmit analog circuitry 202F of transmitter subsystem 202 enables the detection, at the wireless host computing device 102, of the presence and range of wireless receiving device 104, based on reflected power levels. As noted above, transmitted power levels are a function of both forward power and reflected power levels. In turn, reflected power is a function of impedance changes along the power signal's transmission path. Thus, in the disclosed wireless transmission environment 100, if wireless receiving device 104 is not present, then a high impedance is presented and the majority of the transmitted power signal is reflected back toward wireless host computing device 102.

Conversely, if wireless receiving device 104 is present, then less of the transmitted power signal is reflected back toward wireless host computing device 102. The amount of how much is reflected back is related to: (a) the distance (e.g., in X/Y/Z directions) and spatial orientation of receive antenna 112 with respect to transmit antenna 106; and (b) the load (i.e. power draw) of wireless receiving device 104.

Figure 5:
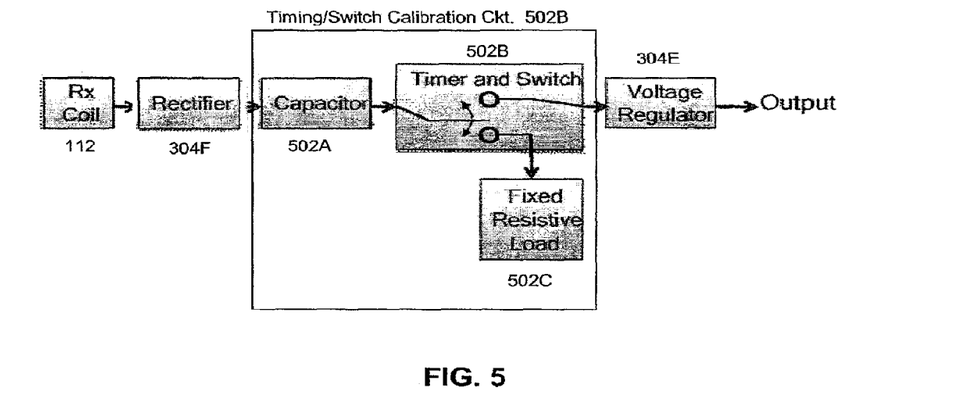
FIG. 5 depicts a functional block diagram of receiver timer and switch calibration circuit, in accordance with various aspects of the present disclosure.

In some embodiments, the uncertainty of what load a particular wireless receiver device 104 may possess, is obviated by providing timer and switch calibration circuit 502 in receiver subsystem 304, as depicted in FIG. 5. Timer and switch calibration circuit 502 may be interposed between voltage rectifier 304F and voltage regulator 304E of receiver subsystem 304. During an initial calibration time interval (e.g., 0.1 ms, 10 ms, 100 ms, etc.), the rectified AC voltage charges capacitor 502A to provide a DC voltage signal and switch 502B operates to couple a predetermined, fixed resistive load 502C by supplying the DC voltage signal to resistive load 502C and decoupling voltage regulator 304E.

During this initial calibration time interval, the wireless host computing device 102 transmits a power signal and wireless receiver device 104 operates to present the fixed resistive load. Because the transmit power level and receive fixed load are known for this time interval, the presence wireless receiving device 104 and the spatial distance between the receiving device 104 and wireless host computing device 102 can be determined by sensing the reflected power, as discussed in more detail below. It will also be appreciated that, by decoupling voltage regulator 304E in receiver subsystem 304, timer and switch calibration circuit 502 also serve to ameliorate introductory nonlinearities caused by voltage regulator 304E.

After the initial calibration time interval has lapsed, timer and switch calibration circuit 502 switches connectivity to re-couple voltage regulator 304E for normal wireless power transfer operations of receiver device 104.

Figure 6:
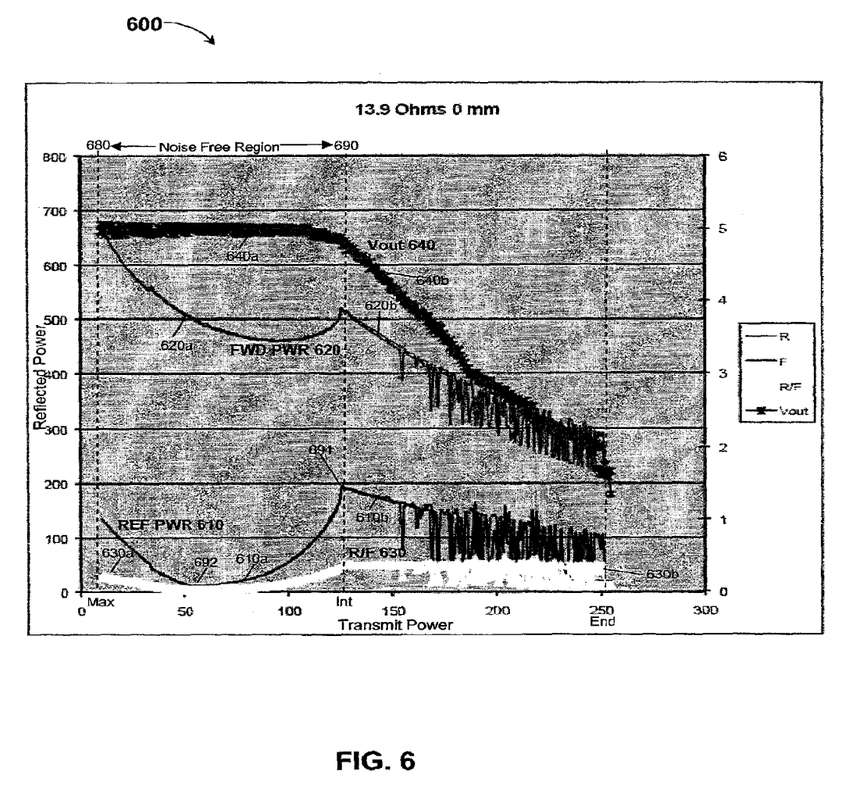
FIG. 6 depicts a characteristic response of reflected power vs. forward power, in accordance with various aspects of the present disclosure.

With regard to the relationship between reflected power levels and spatial distance, FIG. 6 depicts a characteristic response of reflected power vs. forward power for a range of transmit power levels for a given fixed resistive load and a particular spatial position (e.g., range and orientation with respect to device 102, transmitter 202 or transmitter antenna 106) of receiving device 104. In one non-limiting implementation, the fixed load is selected as 13.9 ohms, and the device position is chosen as 0 mm offset. As shown, plot 600 includes a range of transmit power levels (e.g., as controlled by controller 202E) on the x-axis ranging from values zero to 300, wherein each of those values is representative (and function) of a particular transmit power level, and as such, is not an actual transmit power level. Moreover, the x-axis represent the transmit power level in a decreasing order, i.e., from a maximum transmit power level represented by "0" to a minimum transmit power level represented by "300." In accordance with one or more exemplary non-limiting configurations of transmitter subsystem 202 and/or controller 202E, the value "0" on the x-axis corresponds to a transmit power level equal to about 15 W. Further, the y-axis of plot 600 correspond to a range of reflected power levels, e.g., measured by directional power coupler portion and a power detector circuit portion 408. Similar to the x-axis values, the range of values from zero to 800 on the y-axis are representative (and function) of respective measured reflected power levels, and as such, those numbers are not the actual reflected power levels. However, the y-axis values correspond to an increasing range of reflected power levels, i.e., from a minimum measured reflected power level represented by "0" to a maximum reflected power level represented by "800."

As shown in FIG. 6, plot 600 includes curve "R" 610 depicting change in reflected power level responsive to changing transmit power levels, curve "F" 620 depicting change in forward power level responsive to changing transmit power levels, curve "R/F" 630 depicting change in the ratio of reflected power level to forward power level responsive to changing transmit power levels, and curve "Vout" 640 depicting change in the output voltage at the fixed load of receiving device 104 responsive to changing transmit power levels. In some embodiments, performance data related to one or more above-mentioned curves are collected after an initial calibration period (discussed above), e.g., after receiving device 104 and/or receiver subsystem 304 configures the timer and switch module to switch from the fixed resistive load to the voltage regulator. As shown in FIG. 6, it has been observed that, for a first decreasing range of the transmit power levels from a maximum value (indicated by label "max") to a lower transmit level corresponding to an intermediate point labeled "int" on the x-axis, the measured reflected power levels and forward power levels each exhibit a "U-shaped" curve, labeled as 610a and 620a, respectively. In other words, for decreasing transmit power levels from point "max" to point "int" (i.e., the "max-int" region), each of the reflected and forward powers are initially measured to be at a high level (e.g., R at about value 130, and F at about value 670 on the y-axis). The reflected and forward powers then decrease to a lowest "dip" point (e.g., R at about value 10, and F at about value 480 on the y-axis), and finally the measured powers increase to another high level (e.g., R at about value 200, and F at about value 505). The ratio performance illustrated by curve 630 also exhibits a similar "U-shaped" curve (although with a shallower dip point) in the max-int region. As is also shown in FIG. 6, for the transmit power levels in the max-int region, the load voltage Vout is measured as a constant maximum value, e.g., equal to 5V.

It has been further observed that, for a further decreasing range of transmit power levels, e.g., from the "int" point to an "end" point on the x-axis (the "int-end" region), the measured reflected power level, forward power level, the R/F ratio, and the output load voltage each decrease with the decreasing transmit power level within the int-end region (indicated by labels 610b, 620b, 630b, and 640b, respectively). Moreover, a significant portion of all those measured quantities are observed to be "noisy."

Figure 7A:
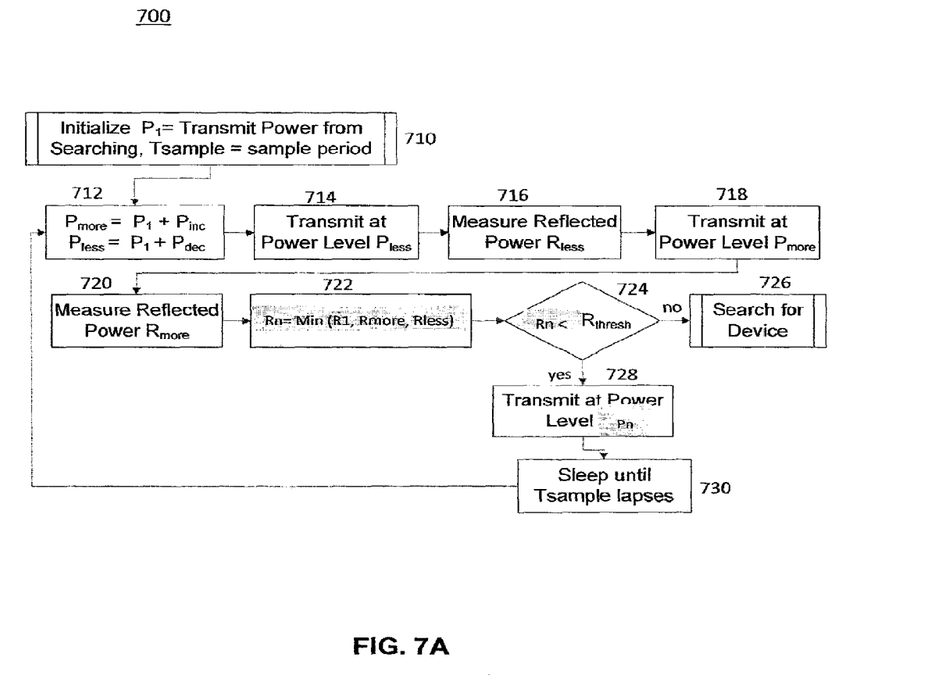
FIGS. 7A and 7B depict flowcharts of methods relating control of wireless transmit power, in accordance with various aspects of the present disclosure.
Figure 7B:
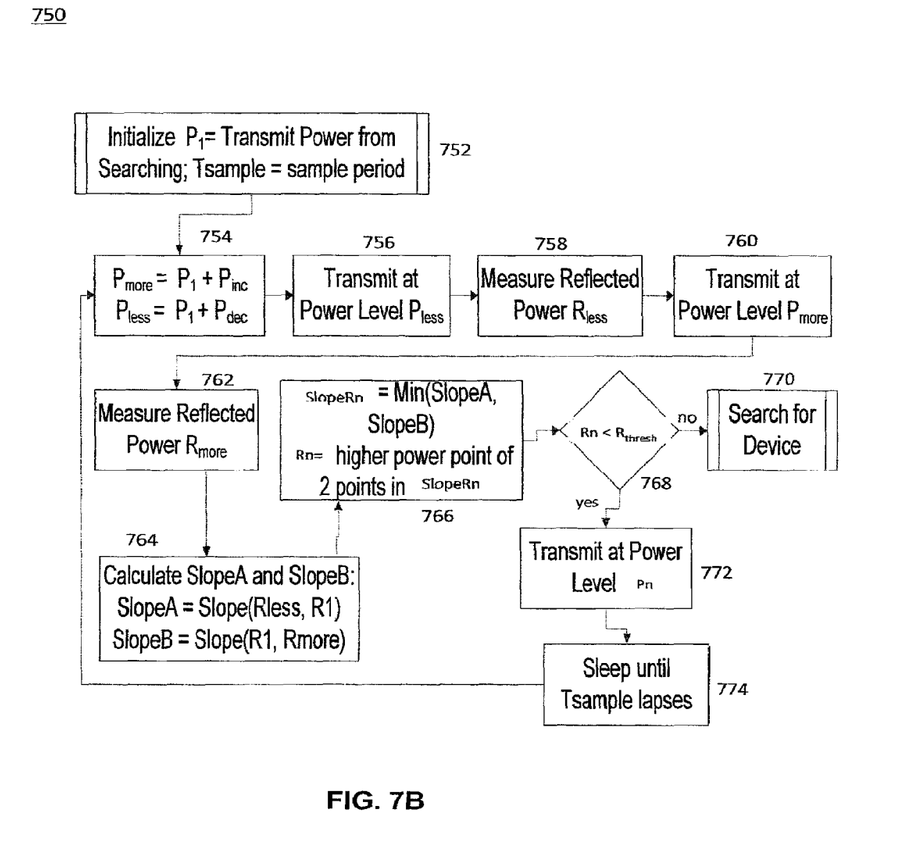

Referring now to FIGS. 7A, 7B, generally, flowcharts 700, 750 are representative of, for example, methods of dynamic wireless power control implemented at, or associated with, wireless host computing device 102 and/or transmitter subsystem 202. Flowcharts 700, 750 are further representative of exemplary machine-readable instructions for implementing various operations carried out by one or more processors. In some embodiments, controller 202E within, or operatively associated with, a transmitter (or transmitter subsystem 202) is configured to control the transmit power level, e.g., by providing the "PWR CNTRL" signal (as shown in FIG. 4). For example, the PWR CNTRL signal may be indicative of the change in (or setting of) the transmit power level that needs to be realized at the transmitter. As discussed above, controller 202E may generate and send various control signals including the PWR CNTRL signal to control the output of DC/DC converter 402, which in turn controls the output of power amplifier 404. And, because the output of power amplifier 404 is directly associated with the transmit power level, the PWR CNTRL signal provided by controller 202E may be considered as ultimately controlling the transmit power level. Accordingly, any reference to setting, arranging, updating, changing, and/or determining the transmit power level in this disclosure may relate to power control functions realized based on functions performed by controller 202E (based on control signal(s) provided therefrom). As such, at least part of controller 202E configured to perform one or more power control functions based on one or more methods disclosed herein (e.g., with respect to FIGS. 7A, 7B) may be referred to as a "power control module." Additionally, or alternatively, other controllers or processors operatively associated with the transmitter (e.g., transmitter subsystem 202) may be used for dynamic power control in ways that will be apparent to one of ordinary skill in the art.

The machine-readable instructions comprise an algorithm for execution at the transmitter by: (a) a processor, (b) a controller (e.g., controller 202E), and/or (c) one or more other suitable processing device(s) within, or operatively associated with, for example, the transmitter. The algorithms may be implemented in software stored on tangible computer readable media such as, for example, a flash memory, a CD-ROM, a floppy disk, a hard drive, a digital video (versatile) disk (DVD), or other memory devices, but persons of ordinary skill in the art will readily appreciate that the entire algorithm and/or parts thereof could alternatively be executed by a device other than a processor and/or implemented in firmware or dedicated hardware in a well known manner (e.g., it may be implemented by an application specific integrated circuit (ASIC), a programmable logic device (PLD), a field programmable logic device (FPLD), a field programmable gate array (FPGA), discrete logic, or the like). For example, at least some of the components of the transmitter and receiver could be implemented by software, hardware, and/or firmware, a combination(s) thereof. Also, some portions of the machine-readable instructions represented by the processes of flowcharts 700, 750 may be implemented manually at the transmitter, for example, using a command line interface (CLI) prompt window operated by a user. Further, although the example algorithm is described with reference to flowcharts 700, 750, persons of ordinary skill in the art after reading this disclosure will readily appreciate that many other methods of implementing the methods of dynamically controlling the wireless transmit power level may alternatively be used. For example, the order of execution of the blocks in flowcharts 700, 750 may be changed, and/or some of the blocks described may be changed, eliminated, or combined.

In FIGS. 7A, 7B, flowcharts 700, 750 of methods for dynamically controlling the transmit power level, in accordance with various aspects of the present disclosure, will be described with reference back to FIGS. 2, 4, and 6. For example, methods disclosed herein may relate to controlling the transmit power level within "noise-free" bounds (or a "noise-free" region) of the operation of the wireless power system. In the context of dynamic power control disclosed herein, a "noise-free" region may be defined by the lines 680, 690 in FIG. 6. As can be observed in FIG. 6, within the region defined by lines 680, 690, the load voltage Vout at the receiver (e.g., receiving device 104) is constant at its maximum value, e.g., 5V. Also, in the noise-free region, the measured reflected power and forward power are observed to be noise-free, represented by "U-shaped" portions 610a, 620a of curves "R" and "F," respectively. In some embodiments, the goal of the dynamic power control techniques disclosed herein is to determine and set the transmit power at the optimal level within the noise-free region, e.g., corresponding to the least reflected power level (692 in FIG. 6), or the minimum transmit power level within the noise-free region, e.g., corresponding to the point of the highest slope in curve "R" (694 in FIG. 6).

Once the operational transmit power level is selected corresponding to the least reflected power level (692) or to the highest curve slope (694), the operational transmit power level may be checked, e.g., periodically, to determine if it needs to be updated. Although one or more methods disclosed herein are described with regard to experimental results (depicted in FIG. 6, for example) for a particular implementation of the wireless power transmitter and receiver, it will be apparent to one of ordinary skill in the art that such implementation and experimental results are not limiting, and other configurations of the transmitter and/or receiver may be used that may result in same or different performance curves for the measured reflected power, forward power, and/or load voltage.

Turning now to flowchart (or process) 700, which begins at operation 710, in which controller 202E may initialize the transmit power level for the power transferred from the transmitter (e.g., host computing device 102) to the receiver (e.g., receiving device 104). For example, the initial power level may be selected to be a high value, such as, a maximum level that can be generated at transmission subsystem 202. In some embodiments, the transmit power level is initialized to the maximum level equal to about 15 W. Further, because within the noise-free region the output load voltage at the receiver is constant at its maximum value, and the reflected and forward powers are noise-free, for maximum efficiency, controller 202E may be configured to decease the transmit power level from the initial (maximum) level to an operational level ("P1") within the noise-free operation region.

In some embodiments, the operational transmit power level corresponds to a lowest reflected power level within the noise-free region (indicated by point 692). For the transmitter and receiver configurations chosen to collect data illustrated in FIG. 6, point 692 corresponds to transmit power level represented by value 55 on the x-axis. However, other configurations may result in different x-axis values (and therefore, different transmit power levels) corresponding to point 592.

Alternatively, in some embodiments, the operational transmit power level corresponds to a level within the noise-free region that is even less than a transmit power level that corresponds to a lowest reflected power level (692). For example, the operational power level may correspond to point of highest rate of change of the reflected power level with respect to the transmit power level within the noise-free region, e.g., point 694 representing the highest slope of curve "R" to the right of point 692 on the x-axis. Although such an operational power level may correspond to a higher reflected power level (and hence, may not be the optimal transmit power level), that operational power level indicates maximum efficiency, as it is the minimum transmit power level that may be used for maximum load voltage with noise free reflected power.

In some embodiments, before operation 710, the presence and availability of the receiver may be determined. For example, as discussed above, wireless host computing device and/or transmitter subsystem 202 may be configured to detect whether the receiver is present and within range for power transfer, e.g., based on measurement of reflected (and/or forward) power levels. Other receiver detection techniques may be used. In this case, controller 202E may initialize and also set the operational transmit power level (P1) equal to the power level that was used for searching or determining the presence of receiving device 104.

Also, in operation 710, process 700 selects and sets a sample period ($T_{sample}$) indicating a cycle period in which it is checked whether the operational transmit power level needs to be updated. The sample period may be selected as a predetermined time period equal to about 100 μs, about 10 μs, or about 100 ms. The reasons to update the operational level may include, but not limited to, change in the spatial location and/or orientation of the receiver with respect to the transmitter, and/or change in the load of the receiver. Further, in some embodiments, the reflected power level, R1 corresponding to the operational transmit power level P1 is measured by circuitry 408 (or is known) and stored in a memory for further processing by controller 202E, as discussed below.

At operation 712, controller 202E may be configured to select at least one trial level for the transmit power, which is close to (more or less than) the current operational level P1. For example, two trials levels may be selected, $P_{more}$ and $P_{less}$, which are higher and lower than the operational level P1 by amounts $P_{inc}$ and $P_{dec}$, respectively. In some embodiments, $P_{inc}$ and $P_{dec}$ each is equal to a power level corresponding to two units on the x-axis of FIG. 6. At operation 714, device 102 transmits wireless power to receiving device 104 at transmit power level $P_{more}$, and at operation 716, directional coupler and power detection circuitry 408 (or a "measurement module") measures the reflected power level, $R_{more}$ for transmit power level $P_{more}$.

Further, at operation 718, device 102 transmits wireless power to receiving device 104 at transmit power level $P_{less}$, and at operation 720, directional coupler and power detection circuitry 408 measures the reflected power level, $R_{less}$ for transmit power level $P_{less}$. In some embodiments, the measured reflected power levels (and forward power levels) corresponding to specific (e.g., operational or trial) transmit power levels are stored in a memory, e.g., memory 206F or another memory within, or operatively associated with, transmitter subsystem 202 and/or controller 202E. In some embodiments, the measurements of the reflected and forward power levels may be conducted and received from a measurement module, device or apparatus, which is external to the transmitter but communicatively connected with controller 202E.

After the reflected power levels for the trial transmit power levels have been measured, in operation 722, controller 202E may compare the reflected power levels, R1, $R_{more}$ and $R_{less}$, to determine the least level, $R_n$ of the three reflected power levels. In some embodiments, this comparison to determine the least of the measured reflected power levels is conducted if the operational transmit power level P1 is selected as a power level corresponding to a lowest reflected power level within the noise-free region (indicated by point 692). At operation 724, it is determined whether the least reflected power level is less than a (predetermined) threshold reflected power level, $R_{thresh}$. If it is determined that the least reflected power level is not less than the threshold, $R_{thresh}$, asynchronous (or synchronous) to the sample period $T_{sample}$, in operation 726, controller 202E may be configured to search for receiving device 104, or determine whether receiving device 104 is still present, within an operational range of host computing device 102, or both, based on, e.g., at least a measured reflected power level for the current operational transmit power level. In some embodiments, based on a determination that receiving device 104 is not present, or not within an operational range, controller 202E ceases the power transfer from the transmitter.

However, if it is determined that the least reflected power level is less than the threshold, $R_{thresh}$, a new operational wireless transmit power level, $P_n$ corresponding to least reflected power level is configured by controller 202E. As such, if in operation 722, the reflected power level corresponding to the current operational level is determined to be the least of the three values, the current operational transmit power level is maintained as the new operational level; otherwise, the new operational level is selected as one of $P_{more}$ or $P_{less}$. At operation 728, wireless power is transmitted from device 102 to receiving device 104 at the new operational transmit power level. Finally, process 700 at operation 730 waits for the current cycle bound by the period $T_{sample}$ to get over before restarting the process at operation 712.

Referring to FIG. 7B, flowchart or process 750 relates to another method of determining the new operational level, P. In process 750, operations 752, 754, 756, 758, 760, and 762 are same as operations 710, 712, 714, 716, 718, and 720, respectively, of process 700 described above. Accordingly, at the end of operation 762, reflected power levels (R1, $R_{more}$ and $R_{less}$) for the current operational transmit power level and the two trial transmit power levels are measured and available for further processing by controller 202E. In some embodiments, process 750 relates to a dynamic power control method in which the operational transmit power level, P1 is selected as a level corresponding to a highest rate of change (or slope) of the reflected power level within the noise-free region (indicated by point 694).

At operation 764, controller 202E may be configured to determine a first rate of change (or slopeA) of the reflected power level based on the reflected power levels, R1 and $R_{less}$. Also at operation 764, controller 202E may be further configured to determine a second rate of change (or slopeB) of the reflected power levels, R1 and $R_{more}$. At operation 766, controller 202E may determine the minimum or least of the two rates of change, slopeA and slopeB (e.g., that is greater than zero) as slope$R_n$, and select the corresponding reflected power level (either $R_{more}$ or $R_{less}$) as the new reflected power level $R_n$. Operations 768, 770, 772, and 774 are same as operations 724, 726, 728, and 730, respectively, of process 700 described above. Accordingly, in process 750, controller 202E, within each sample period, configures the transmit power level at device 102 equal to a new operation transmit power level $P_n$ corresponding to the determined reflected power level $R_n$.

Although the algorithms or processes 700, 750 described above use reflected power levels for determining and updating an operational transmit power level, in some embodiments, total RF power levels, which may be equal to a sum the reflected and forward power levels, may be used for dynamic power control. The use of total RF power, instead of reflected power, may eliminate the need for directional coupler component (which distinguishes reflected power from forward power) in directional coupler and power detection circuitry 408. In this case, the total RF power may be used to estimate load, and dynamically adjust the transmit power level as a function of load at receiving device 104.

Having thus described the basic concepts, it will be rather apparent to those skilled in the art after reading this detailed disclosure that the foregoing detailed disclosure is intended to be presented by way of example only and is not limiting. Various alterations, improvements, and modifications will occur and are intended to those skilled in the art, though not expressly stated herein. It is to be noted that although transmitted power is being described here, both power and/or energy can be transmitted and received. These alterations, improvements, and modifications are intended to be suggested by this disclosure, and are within the spirit and scope of the exemplary aspects of this disclosure. Additionally, the recited order of processing elements or sequences, or the use of numbers, letters, or other designations therefore, is not intended to limit the claimed processes and methods to any order except as can be specified in the claims. Although the above disclosure discusses through various examples what is currently considered to be a variety of useful aspects of the disclosure, it is to be understood that such detail is solely for that purpose, and that the appended claims are not limited to the disclosed aspects, but, on the contrary, are intended to cover modifications and equivalent arrangements that are within the spirit and scope of the disclosed aspects.

What is claimed is:

1. A method, comprising:
   setting, at a transmitter, an operational level of transmit power at which the transmitter transmits power;
   measuring, at the transmitter, a first reflected power level corresponding to the operational level of the transmit power; and
   determining, at the transmitter, a new operational level of the transmit power at which the transmitter is to transmit power, wherein said determining includes:
   selecting at least one trial transmit power level, and
   determining the at least one trial level as the new operational level of the transmit power at which the transmitter transmits power, based on the first reflected power level and a second reflected power level measured corresponding to the at least one trial level of the transmit power, wherein the operational level corresponds to a lowest reflected power level.

2. The method of claim 1, wherein said determining includes determining the new operational level based on the least of the first reflected power level and the second reflected power level.

3. The method of claim 1, wherein the operational level corresponds to a highest rate of change of the first reflected power level level, and wherein the operational level is less than a transmit power level that corresponds to the lowest reflected power level.

4. The method of claim 3, wherein said determining further includes:
   selecting at least two trial transmit power levels,
   determining a first rate of change of the reflected power level corresponding to the operational level and a first of the at least two trial levels, and a second rate of change of the reflected power level corresponding to the operational level and a second of the at least two trial levels, and
   setting the trial level corresponding to the least of the first and second rates of change as the new operational level of the transmit power.

5. The method of claim 1, further comprising:
   initializing, at the transmitter, the transmit power to an initial level; and
   decreasing, at the transmitter, the transmit power from the initial level to the operational level.

6. The method of claim 1, wherein said determining the new operational level operation is performed periodically.

7. The method of claim 6, wherein a period of performing said determining operation is predetermined to about 100 μs, 10 μs, or 100 ms.

8. The method of claim 1, further comprising determining whether a receiver is present, within an operational range of the transmitter, or both; and
   based on a determination that the receiver is not present, or not within an operational range of the transmitter, configuring the transmitter to cease power transmission.

9. The method of claim 8, wherein said determining whether the receiver is still present, within an operational range of the transmitter, or both is based at least on a measured reflected power level.

10. The method of claim 8, wherein said determining whether the receiver is still present, within an operational range of the transmitter, or both is performed asynchronous to said determining the new operational level operation.

11. The method of claim 4, wherein the least of the first and second rates of change is greater than zero.

12. The method of claim 4, wherein a first of the at least two trial levels is less than the operational level, and a second of the at least two trial levels is greater than the operational level.

13. The method of claim 5, wherein the initial transmit power level is less than the transmit power level that corresponds to a lowest reflected power level.

14. A non-transitory computer-readable medium comprising computer-readable instructions, the computer-readable instructions when executed by one or more processors, causes the one or more processors to carry out a plurality of operations comprising:
   setting, at a transmitter, an operational level of transmit power at which the transmitter transmits power;
   measuring, at the transmitter, a first reflected power level corresponding to the operational level of the transmit power; and
   determining, at the transmitter, a new operational level of the transmit power at which the transmitter is to transmit power, wherein said determining includes:
   selecting at least one trial transmit power level, and
   determining the at least one trial level as the new operational level of the transmit power at which the transmitter transmits power, based on the first reflected power level and a second reflected power level measured corresponding to the at least one trial level of the transmit power, wherein the operational level corresponds to a lowest reflected power level.

15. The medium of claim 14, wherein said determining includes determining the new operational level based on the least of the first reflected power level and the second reflected power level.

16. The medium of claim 14, wherein the operational level corresponds to a highest rate of change of the first reflected power level, and wherein the operational level is less than a transmit power level that corresponds to the lowest reflected power level.

17. The medium of claim 16, wherein said determining further includes:
selecting at least two trial transmit power levels,
determining a first rate of change of the reflected power level corresponding to the operational level and a first of the at least two trial levels, and a second rate of change of the reflected power level corresponding to the operational level and a second of the at least two trial levels, and
setting the trial level corresponding to the least of the first and second rates of change as the new operational level of the transmit power.

18. The medium of claim 14, wherein the operations further comprise:
initializing, at the transmitter, the transmit power to an initial level; and
decreasing, at the transmitter, the transmit power from the initial level to the operational level.

19. A device, comprising:
a power control module configured to:
set an operational level of transmit power at which the transmit power is transmitted,
measure a first reflected power level corresponding to the operational level of the transmit power; and
determine a new operational level of the transmit power at which the transmit power is to be transmitted, wherein to determine the new operational level, the power control module is further configured to:
select at least one trial transmit power level, and
determine the at least one trial level as the new operational level of the transmit power at which the transmit power is transmitted, based on the first reflected power level and a second reflected power level measured corresponding to the at least one trial level of the transmit power, wherein the operational level corresponds to a lowest reflected power level.

20. The device of claim 19, wherein the operational level corresponds to a highest rate of change of the first reflected power level with respect to the transmit power level, and wherein the operational level is less than a transmit power level that corresponds to the lowest reflected power level.

21. The device of claim 19, wherein the power control module configured is further configured to:
select at least two trial transmit power levels,
determine a first rate of change of the reflected power level corresponding to the operational level and a first of the at least two trial levels, and a second rate of change of the reflected power level corresponding to the operational level and a second of the at least two trial levels, and
set the trial level corresponding to the least of the first and second rates of change as the new operational level of the transmit power.

* * * * *

UNITED STATES PATENT AND TRADEMARK OFFICE
CERTIFICATE OF CORRECTION

PATENT NO. : 9,692,260 B2
APPLICATION NO. : 13/976340
DATED : June 27, 2017
INVENTOR(S) : Walsh et al.

Page 1 of 1

It is certified that error appears in the above-identified patent and that said Letters Patent is hereby corrected as shown below:

In the Claims

In Column 13, Line 63, in Claim 3, before "level,", delete "level"

Signed and Sealed this
Tenth Day of April, 2018

Andrei Iancu
*Director of the United States Patent and Trademark Office*